United States Patent
Chen et al.

(10) Patent No.: US 9,653,177 B1
(45) Date of Patent: May 16, 2017

(54) ONE TIME PROGRAMMABLE NON-VOLATILE MEMORY AND READ SENSING METHOD THEREOF

(71) Applicant: eMemory Technology Inc., Hsin-Chu (TW)

(72) Inventors: Yung-Jui Chen, New Taipei (TW); Chih-Hao Huang, Taichung (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 0 days.

(21) Appl. No.: 15/408,942

(22) Filed: Jan. 18, 2017

Related U.S. Application Data

(62) Division of application No. 14/630,766, filed on Feb. 25, 2015.

(51) Int. Cl.
| | |
|---|---|
| G11C 17/18 | (2006.01) |
| G11C 17/16 | (2006.01) |
| G11C 7/08 | (2006.01) |
| G11C 7/06 | (2006.01) |
| G11C 7/12 | (2006.01) |

(52) U.S. Cl.
CPC ........... *G11C 17/18* (2013.01); *G11C 7/062* (2013.01); *G11C 7/067* (2013.01); *G11C 7/08* (2013.01); *G11C 7/12* (2013.01); *G11C 17/16* (2013.01)

(58) Field of Classification Search
CPC ................................ G11C 17/18; G11C 17/16
See application file for complete search history.

(56) References Cited

U.S. PATENT DOCUMENTS

| | | | |
|---|---|---|---|
| 7,046,569 B2 | 5/2006 | Ito et al. | |
| 7,269,047 B1 | 9/2007 | Fong et al. | |
| 7,511,982 B2 | 3/2009 | Kurjanowicz et al. | |
| 7,764,532 B2 * | 7/2010 | Kurjanowicz | G11C 17/16 365/100 |
| 7,920,401 B2 | 4/2011 | Xu et al. | |
| 8,077,533 B2 * | 12/2011 | Hunter | G11C 7/065 365/190 |
| 8,223,526 B2 | 7/2012 | Kurjanowicz | |
| 8,259,518 B2 | 9/2012 | Peng et al. | |
| 8,767,433 B2 * | 7/2014 | Kurjanowicz | G11C 17/16 365/200 |
| 8,861,250 B1 | 10/2014 | Wu et al. | |
| 2013/0077381 A1 | 3/2013 | Kwon | |
| 2014/0340955 A1 | 11/2014 | Wu et al. | |

OTHER PUBLICATIONS

Taiwan Intellectual Property Office (TIPO), Office Action issued on Jun. 20, 2016, Taiwan.

* cited by examiner

*Primary Examiner* — Tri Hoang
(74) *Attorney, Agent, or Firm* — WPAT, PC; Justin King; Douglas Hosack

(57) ABSTRACT

A read sensing method for an OTP non-volatile memory is provided. The memory array is connected with plural bit line pairs. Firstly, the plural bit line pairs are precharged to a precharge voltage. Then, a selected memory cell connected with a specific bit line pair is determined. Then, two bit lines of the specific bit line pair are respectively connected with the data line and the reference line and are discharged to a reset voltage. After a first cell current and a second cell current from the specific bit line pair are received, a first voltage level of the data line and a second voltage level of the reference line are gradually changed from the reset voltage. According to a result of comparing the first voltage level and the second voltage level, an output signal is generated.

10 Claims, 7 Drawing Sheets

ONE TIME PROGRAMMABLE NON-VOLATILE MEMORY AND READ SENSING METHOD THEREOF

This is a divisional application of co-pending U.S. application Ser. No. 14/630,766, filed Feb. 25, 2015, the subject matter of which is incorporated herein by reference.

FIELD OF THE INVENTION

The present invention relates to a non-volatile memory, and more particularly to a one time programmable non-volatile memory and a read sensing method thereof.

BACKGROUND OF THE INVENTION

As is well known, the memory cell of a one time programmable non-volatile memory (also referred as an OTP non-volatile memory) can be programmed once. After the OTP memory cell is programmed, the storage state of the OTP memory cell is determined and the storage state of the OTP memory cell fails to be modified.

Generally, the OTP memory cells may be classified into two types, i.e. a fuse type OTP memory cell and an anti-fuse type OTP memory cell.

Before being programmed, the anti-fuse type OTP memory cell has a high-impedance storage state. After being programmed, the anti-fuse type OTP memory cell has a low-impedance storage state. On the other hand, before being programmed, the fuse type OTP memory cell has a low-impedance storage state. After being programmed, the fuse type OTP memory cell has a high-impedance storage state.

Generally, different types of OTP memory cells have different structures and characteristics. For accurately recognizing the storage states of different types of OTP memory cells, the corresponding read sensing circuits are different.

Please refer to FIGS. 1A, 1B and 1C. FIG. 1A is a schematic circuit diagram illustrating a portion of a conventional anti-fuse type OTP non-volatile memory. FIG. 1B is a flowchart illustrating a read sensing method of the conventional anti-fuse type OTP non-volatile memory of FIG. 1A. FIG. 1O is a sequence diagram illustrating associated signals for the conventional anti-fuse type OTP non-volatile memory of FIG. 1A. The conventional anti-fuse type OTP non-volatile memory is disclosed in U.S. Pat. No. 8,223,526.

As shown in FIG. 1A, the memory array of the conventional anti-fuse type OTP non-volatile memory comprises a precharge circuit 310, OTP memory cells 302 and 304, word lines WL1~WLi, bit lines BL1 and BL2, isolation transistors 306 and 308, a reference charge circuit REF and a bit line sense amplifier 314. The OTP memory cells 302 and 304 are anti-fuse type OTP memory cells.

The word lines WL1~WLi are connected with the corresponding OTP memory cells 302 and 304. Moreover, the OTP memory cells 302 and 304 are connected with the bit lines BL1 and BL2, respectively. According to a precharge signal BLPCH, the precharge circuit 310 is controlled to charge the bit lines BL1 and BL2 to a precharge voltage VPCH. According to an enable signal REF_EN, the reference charge circuit REF is controlled to charge the unselected bit line BL1 or BL2 to a reference voltage. Moreover, according to an isolation signal ISO, the isolation transistors 306 and 308 are selectively turned on or turned off. Consequently, the bit lines BL1 and BL2 are coupled with or decoupled from the sense lines SL1 and SL2.

The bit line sense amplifier 314 is operated according to a high logic level enable signal H_EN and a low logic level enable signal L_EN.

As shown in FIG. 1B, the read sensing method comprises the following steps. The process of sensing the OTP memory cell 302 by the bit line sense amplifier 314 is taken as an example. Firstly, in a step 200, the bit lines BL1 and BL2 and the sense lines SL1 and SL2 are precharged to a first supply voltage, i.e. the precharge voltage VPCH. Meanwhile, since the isolation signal ISO has a high logic level, the bit lines BL1 and BL2 are coupled with the sense lines SL1 and SL2 through the on-state isolation transistors 306 and 308.

Then, in a step 202, a selected word line is driven according to a read voltage VREAD. That is, the read voltage VREAD is provided to the word line WL1, but the other word lines WL2~WLi are not driven. Then, in a step 204, the reference voltage is added to the unselected bit line and the unselected sense line. That is, the bit line BL2 and the sense line SL2 are charged to the reference voltage.

Then, in a step 206, the OTP memory cell is decoupled from the corresponding sense line. That is, according to a low logic level of the isolation signal ISO, the bit lines BL1 and BL2 are decoupled from the sense lines SL1 and SL2 through the off-state isolation transistors 306 and 308. Then, in a step 208, the bit line sense amplifier 314 is activated to sense a storage state of the selected OTP memory cell.

FIG. 1C is a sequence diagram illustrating associated signals for the OTP memory cell 302. It is assumed that the OTP memory cell 302 has a high-impedance storage state.

During the high logic level interval of the precharge signal BLPCH, the isolation signal ISO also has the high logic level. Consequently, the bit lines BL1 and BL2 are coupled with the sense lines SL1 and SL2 are precharged to the precharge voltage VPCH (e.g. a ground voltage).

After the bit lines BL1 and BL2 are coupled with the sense lines SL1 and SL2 are precharged to the precharge voltage VPCH, the word line WL1 and the enable signal REF_EN are enabled. Consequently, the OTP memory cell 302 is a selected memory cell, the bit line BL1 is a selected bit line, and the bit line BL2 is an unselected bit line.

Moreover, during the enabling periods of the word line WL1 and the enable signal REF_EN, the bit lines BL1 and BL2 and the sense lines SL1 and SL2 rise from the precharge voltage VPCH. Since the OTP memory cell 302 has the high-impedance storage state, the rise rates of the selected bit line BL1 and the selected sense line SL1 are lower than the rise rates of the unselected bit line BL2 and the unselected sense line SL2.

At the time point t1, the isolation signal ISO has the low logic level. Consequently, the bit lines BL1 and BL2 are decoupled from the sense lines SL1 and SL2 through the off-state isolation transistors 306 and 308. Meanwhile, the voltage levels of the selected bit line BL1 and the selected sense line SL1 are lower than the voltage levels of the unselected bit line BL2 and the unselected sense line SL2.

At the time point t2, the voltage levels of the bit lines BL1 and BL2 are maintained at the original voltage levels corresponding to the time point t1 because the bit lines BL1 and BL2 are decoupled from the sense lines SL1 and SL2. Moreover, since the bit line sense amplifier 314 is activated, the sense line SL2 with the higher voltage level is increased to the voltage level of the high logic level enable signal H_EN, and the sense line SL1 with the lower voltage level is decreased to the voltage level of the low logic level enable signal L_EN. Since the voltage level of the sense line SL2 is higher than the voltage level of the sense line SL1 after the time point t2, the high-impedance storage state of the OTP memory cell 302 is recognized.

On the other hand, if the voltage level of the sense line SL1 is higher than the voltage level of the sense line SL2 after the bit line sense amplifier 314 is activated, the low-impedance storage state of the OTP memory cell 302 is recognized.

As mentioned above, before the storage state of the OTP memory cell is read, it is necessary to decouple the bit lines from the corresponding sense lines. Then, according to the voltage levels of the sense lines, the storage state of the OTP memory cell can be recognized.

Moreover, U.S. Pat. Nos. 8,259,518 and 7,269,047 also disclose read schemes for reading the storage states of the OTP memory cells with different configurations.

SUMMARY OF THE INVENTION

The present invention provides a one time programmable non-volatile memory and a read sensing method thereof. During the read cycle, the bit line corresponding to the selected OTP memory cell is continuously connected with the data line. Consequently, the cell current outputted from the selected OTP memory cell can continuously charge the data line. According to the output signal, the storage state of the selected OTP memory cell can be recognized.

An embodiment of the present invention provides an OTP non-volatile memory. The OTP non-volatile memory includes a memory array, a controlling circuit, a precharge circuit, a column selector, a reset circuit and a sense amplifier. The memory array includes M×N memory cells, wherein the memory array is connected with M word lines and N bit lines. The controlling circuit includes a voltage generator, a word line driver, a column driver and a timing controller. The voltage generator provides plural supply voltages to the memory array. The word line driver is connected with the M word lines for determining one of the M word lines as a selected word line. The column driver generates N column decoding signals and activates one of the plural column decoding signals at a time. The timing controller generates a precharge signal, a reset signal and an enable signal. The precharge circuit is connected with the N bit lines. When the precharge signal is activated, the precharge circuit provides a precharge voltage to the N bit lines. The column selector is connected with the N bit lines and a data line. The column selector determines one of the N bit lines as a selected bit line according to the N column decoding signals, so that the selected bit line is connected with the data line. The reset circuit is connected with the data line. When the reset signal is activated, the reset circuit provides a reset voltage to the data line. The sense amplifier is connected with the data line and receives a comparing voltage. When the enable signal is activated, the sense amplifier generates an output signal according to a result of comparing a voltage level of the data line with the comparing voltage.

Another embodiment of the present invention provides a read sensing method for an OTP non-volatile memory. The OTP non-volatile memory includes plural memory cells. The memory array is connected with plural bit lines. The read sensing method includes the following steps. Firstly, the plural bit lines are precharged to a precharge voltage. Then, a selected memory cell of the memory array is determined, wherein the selected memory cell is connected with a first bit line of the plural bit lines. Then, the bit line corresponding to the selected memory cell is connected with the data line, and the data line is discharged to a reset voltage. Then, a cell current is received from the selected memory cell, so that a voltage level of the data line is gradually changed from the reset voltage. According to a result of comparing a voltage level of the data line with a comparing voltage, an output signal is generated.

A further embodiment of the present invention provides an OTP non-volatile memory. The OTP non-volatile memory includes a memory array, a controlling circuit, a precharge circuit, a column selector, a reset circuit and a sense amplifier. The memory array includes M×N memory cells. The memory array is connected with M word lines and 2N bit lines, and the 2N bit lines are divided into N bit line pairs. The controlling circuit includes a voltage generator, a word line driver, a column driver and a timing controller. The voltage generator provides plural supply voltages to the memory array. The word line driver is connected with the M word lines for determining one of the M word lines as a selected word line. The column driver generates N column decoding signals and activates one of the plural column decoding signals at a time. The timing controller generates a precharge signal, a reset signal and an enable signal. The precharge circuit is connected with the 2N bit lines. When the precharge signal is activated, the precharge circuit provides a precharge voltage to the 2N bit lines. The column selector is connected with the 2N bit lines, a reference line and a data line. The column selector determines one of the N bit line pairs as a selected bit line pair according to the N column decoding signals, so that a first bit line of the selected bit line pair is connected with the data line and a complementary first bit line of the selected bit line pair is connected with the reference line. The reset circuit is connected with the data line and the reference line. When the reset signal is activated, the reset circuit provides a reset voltage to the data line and the reference line. The sense amplifier is connected with the data line and the reference line. When the enable signal is activated, the sense amplifier generates an output signal according to a result of comparing a voltage level of the data line with a comparing voltage of the reference line.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figures 1A, 1B, 1C:
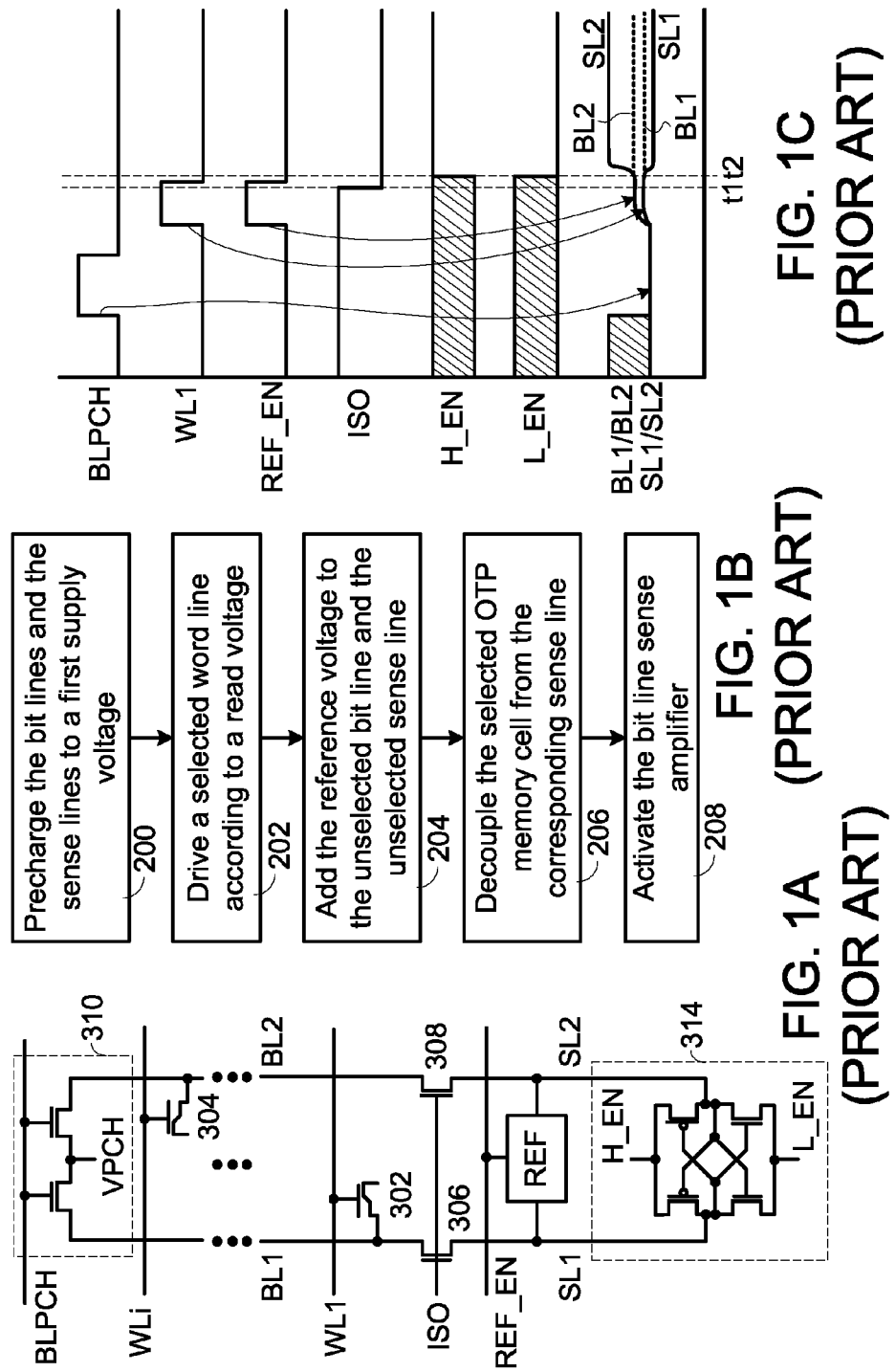
FIG. 1A (prior art) is a schematic circuit diagram illustrating a portion of a conventional anti-fuse type OTP non-volatile memory.
FIG. 1B (prior art) is a flowchart illustrating a read sensing method of the conventional anti-fuse type OTP non-volatile memory of FIG. 1A.
FIG. 1C (prior art) is a sequence diagram illustrating associated signals for the conventional anti-fuse type OTP non-volatile memory of FIG. 1A.
Figure 2B:
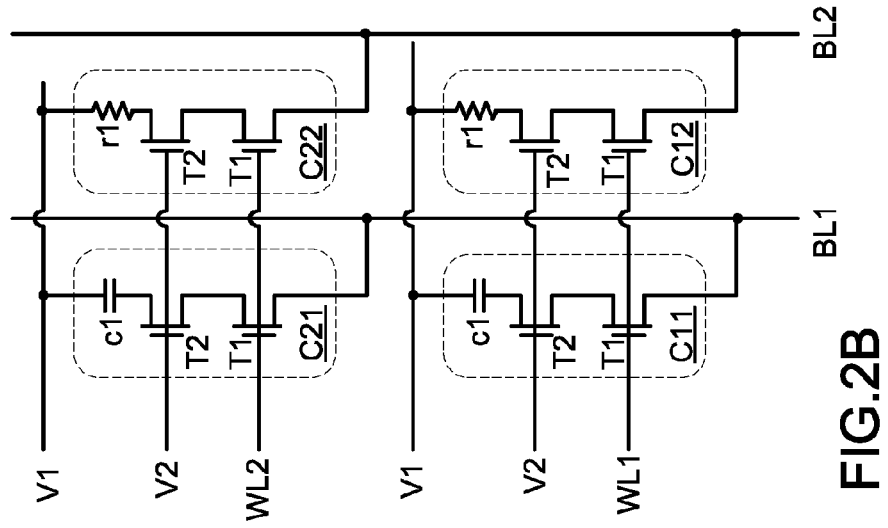
FIGS. 2A and 2B are schematic circuit diagrams illustrating two exemplary memory cell configurations used in an OTP non-volatile memory of the present invention.
Figure 2A:
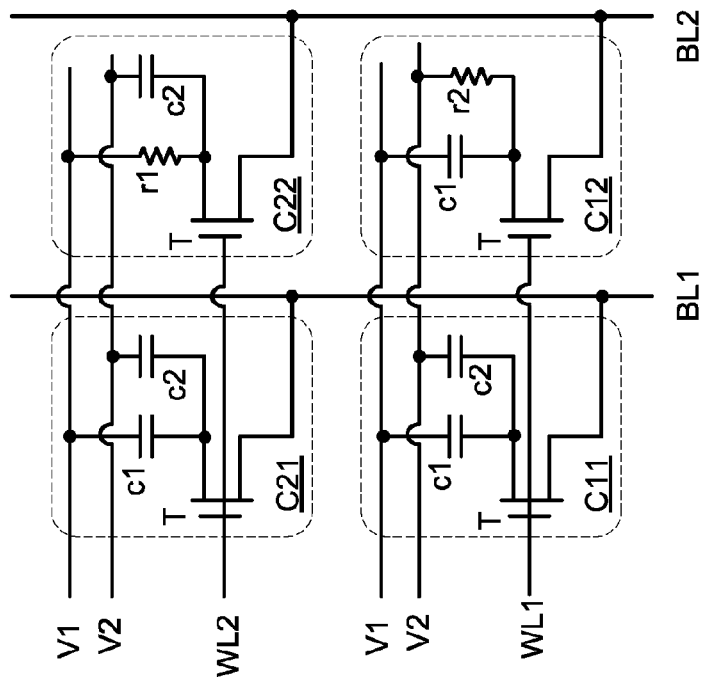

FIGS. 2A and 2B are schematic circuit diagrams illustrating two exemplary memory cell configurations used in an OTP non-volatile memory of the present invention.

As shown in FIG. 2A, a memory array of the OTP non-volatile memory comprises four OTP memory cells C11, C12, C21 and C22, which are arranged in a 2×2 array configuration. Each of the OTP memory cells C11, C12, C21 and C22 is composed of three electronic components. It is noted that the size of the memory array is not restricted. According to the practical requirements, the memory array may comprise M×N memory cells corresponding to M word lines and N bit lines, wherein M and N are positive integers.

For example, the OTP memory cells C11 and C21 are non-programmed OTP memory cells, and the OTP memory cells C12 and C22 are programmed OTP memory cells.

For example, the non-programmed OTP memory cell C11 comprises a select transistor T and two capacitors c1 and c2. The gate terminal of the select transistor T is connected with the word line WL1. The capacitor c1 is connected between the first source/drain terminal of the select transistor T and a first supply voltage V1. The capacitor c2 is connected between the first source/drain terminal of the select transistor T and a second supply voltage V2. The second source/drain terminal of the select transistor T is connected with the bit line BL1.

After the OTP memory cell is programmed, a dielectric layer of the capacitor c1 or the capacitor c2 is ruptured, so that the capacitor c1 or the capacitor c2 is turned into a resistor. For example, the programmed OTP memory cell C22 comprises a select transistor T, a resistor r1 and a capacitor c2. The gate terminal of the select transistor T is connected with the word line WL2. The resistor r1 is connected between the first source/drain terminal of the select transistor T and the first supply voltage V1. The capacitor c2 is connected between the first source/drain terminal of the select transistor T and the second supply voltage V2. The second source/drain terminal of the select transistor T is connected with the bit line BL2.

Moreover, the OTP memory cell corresponding to the selected word line and the selected bit line is determined as a selected OTP memory cell. For example, if the word line WL2 and the bit line BL1 are driven, the OTP memory cell C21 is the selected OTP memory cell. Meanwhile, the OTP memory cell C21 generates a cell current to the bit line BL1. That is, if the word line WL2 is the selected word line and the bit line BL1 is the selected bit line, the OTP memory cell C21 is the selected OTP memory cell.

As shown in FIG. 2A, the OTP memory cells are anti-fuse type OTP memory cells. Consequently, if the non-programmed OTP memory cell is the selected memory cell, the magnitude of the cell current is lower because of the high-impedance storage state. Whereas, if the programmed OTP memory cell is the selected memory cell, the magnitude of the cell current is higher because of the low-impedance storage state.

As shown in FIG. 2B, a memory array of the OTP non-volatile memory comprises four OTP memory cells C11, C12, C21 and C22, which are arranged in a 2×2 array configuration. Each of the OTP memory cells C11, C12, C21 and C22 is composed of three electronic components.

For example, the OTP memory cells C11 and C21 are non-programmed OTP memory cells, and the OTP memory cells C12 and C22 are programmed OTP memory cells.

For example, the non-programmed OTP memory cell C11 comprises a select transistor T1, a bias transistor T2 and a capacitor c1. The gate terminal of the select transistor T1 is connected with the word line WL1. The first source/drain terminal of the select transistor T1 is connected with the first source/drain terminal of the bias transistor T2. The second source/drain terminal of the select transistor T1 is connected with the bit line BL1. The gate terminal of the bias transistor T2 is connected with the second supply voltage V2. The capacitor c1 is connected between the second source/drain terminal of the bias transistor T2 and the first supply voltage V1.

It is to be noted that the capacitor c1 may also be replaced by a varactor. The varactor has a structure such that the capacitance varies as a function of the voltage applied across its terminals.

After the OTP memory cell is programmed, a dielectric layer of the capacitor c1 is ruptured, so that the capacitor c1 is turned into a resistor. For example, the programmed OTP memory cell C22 comprises a select transistor T1, a bias transistor T2 and a resistor r1. The gate terminal of the select transistor T1 is connected with the word line WL1. The first source/drain terminal of the select transistor T1 is connected with the first source/drain terminal of the bias transistor T2. The second source/drain terminal of the select transistor T1 is connected with the bit line BL1. The gate terminal of the bias transistor T2 is connected with the second supply voltage V2. The resistor r1 is connected between the second source/drain terminal of the bias transistor T2 and the first supply voltage V1.

Moreover, the OTP memory cell corresponding to the selected word line and the selected bit line is determined as a selected OTP memory cell. For example, if the word line WL2 and the bit line BL1 are selected, the OTP memory cell C21 is the selected OTP memory cell.

As shown in FIG. 2B, the OTP memory cells are anti-fuse type OTP memory cells. Consequently, if the non-programmed OTP memory cell is the selected memory cell, the magnitude of the cell current is lower because of the high-impedance storage state. Whereas, if the programmed OTP memory cell is the selected memory cell, the magnitude of the cell current is higher because of the low-impedance storage state.

Figure 3:
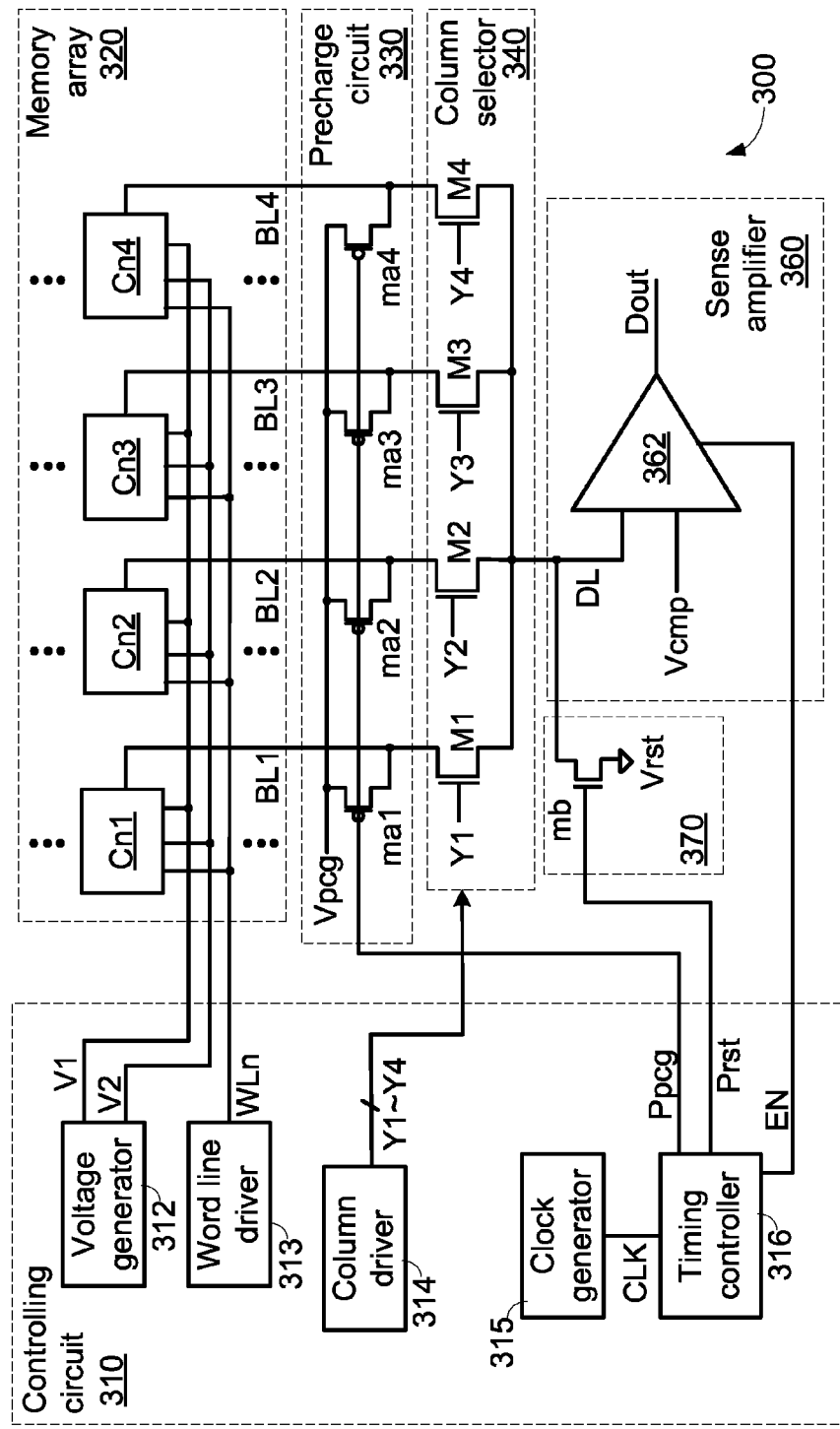
FIG. 3 is a schematic circuit diagram illustrating an OTP non-volatile memory according to an embodiment of the present invention.

FIG. 3 is a schematic circuit diagram illustrating an OTP non-volatile memory according to an embodiment of the present invention. As shown in FIG. 3, the OTP non-volatile memory 300 comprise a controlling circuit 310, a memory array 320, a precharge circuit 330, a column selector 340, a sense amplifier 360 and a reset circuit 370. The memory array 320 comprises plural OTP memory cells. For clarification and brevity, only the OTP memory cells Cn1~Cn4 in the n-th row are shown. The OTP memory cells Cn1~Cn4 are connected with the bit lines BL1~BL4, respectively. In this embodiment, each row comprises four OTP memory cells. It is noted that the number of OTP memory cells in each row is not restricted. Moreover, the OTP memory cells Cn1~Cn4 may have the configurations as shown in FIG. 2A or FIG. 2B.

The controlling circuit 310 comprises a voltage generator 312, a word line driver 313, a column driver 314, a clock generator 315 and a timing controller 316. The voltage generator 312 may provide a first supply voltage V1 and a second supply voltage V2 to the memory array 320. The word line driver 313 is connected with plural word lines of the memory array 320. The word line driver 313 may drive one of the plural word lines. The driven word line is the selected word line. The column driver 314 may generate four column decoding signals Y1~Y4 for selectively determining one of the bit lines BL1~BL4 as the selected bit line. The clock generator 315 may generate a clock signal CLK. The timing controller 316 may receive the clock signal CLK and generates a precharge signal Ppcg, a reset signal Prst and an enable signal EN.

The precharge circuit 330 comprises four switch transistors ma1~ma4. The control terminals of the switch transistors ma1~ma4 receive the precharge signal Ppcg. The first terminals of the switch transistors ma1~ma4 are connected with a precharge voltage Vpcg. The second terminals of the switch transistors ma1~ma4 are connected with the bit lines BL1~BL4, respectively. When the precharge signal Ppcg is activated, the bit lines BL1~BL4 are all precharged to the precharge voltage Vpcg.

The column selector 340 comprises four select transistors M1~M4. The control terminals of the select transistors M1~M4 receive the column decoding signals Y1~Y4, respectively. The first terminals of the select transistors M1~M4 are connected with the bit lines BL1~BL4, respectively. The second terminals of the select transistors M1~M4 are connected with a data line DL. Generally, the column driver 314 activates one of the column decoding signals Y1~Y4 at a time so as to determine the selected bit line.

The reset circuit 370 comprises a switch transistor mb. The control terminal of the switch transistor mb receives the reset signal Prst. The first terminal of the switch transistor mb is connected with a data line DL. The second terminal of the switch transistor mb is connected with a reset voltage Vrst (e.g. a ground voltage). When the reset signal Prst is activated, the data line DL is discharged to the reset voltage Vrst.

The sense amplifier 360 comprises a comparator 362. The comparator 362 is connected with the data line DL and a comparing voltage Vcmp. When the enable signal EN is activated, the comparator 362 generates an output signal Dout according to the result of comparing a voltage level of the data line DL with the comparing voltage Vcmp.

During a read cycle of the OTP non-volatile memory 300, the voltage generator 312 provides the first supply voltage V1 and the second supply voltage V2 to the memory array 320. Before the process of determining the selected OTP memory cell, the timing controller 316 activates the precharge signal Ppcg. Consequently, the bit lines BL1~BL4 are all precharged to the precharge voltage Vpcg. Then, the word line driver 313 and the column driver 314 determine a selected word line and a selected bit line. Consequently, the selected OTP memory cell is determined, and the bit line corresponding to the selected OTP memory cell is connected with the data line DL. Then, the reset signal Prst is activated. Consequently, the data line DL and the bit line corresponding to the selected OTP memory cell are discharged to the reset voltage Vrst. After the reset signal Prst is inactivated, the voltage level of the data line DL is changed from the reset voltage. Then, the enable signal EN is activated. By comparing the voltage level of the data line DL with the comparing voltage Vcmp, the sense amplifier 360 generates the output signal Dout. The output signal Dout indicates the storage state of the selected OTP memory cell.

Figure 4:
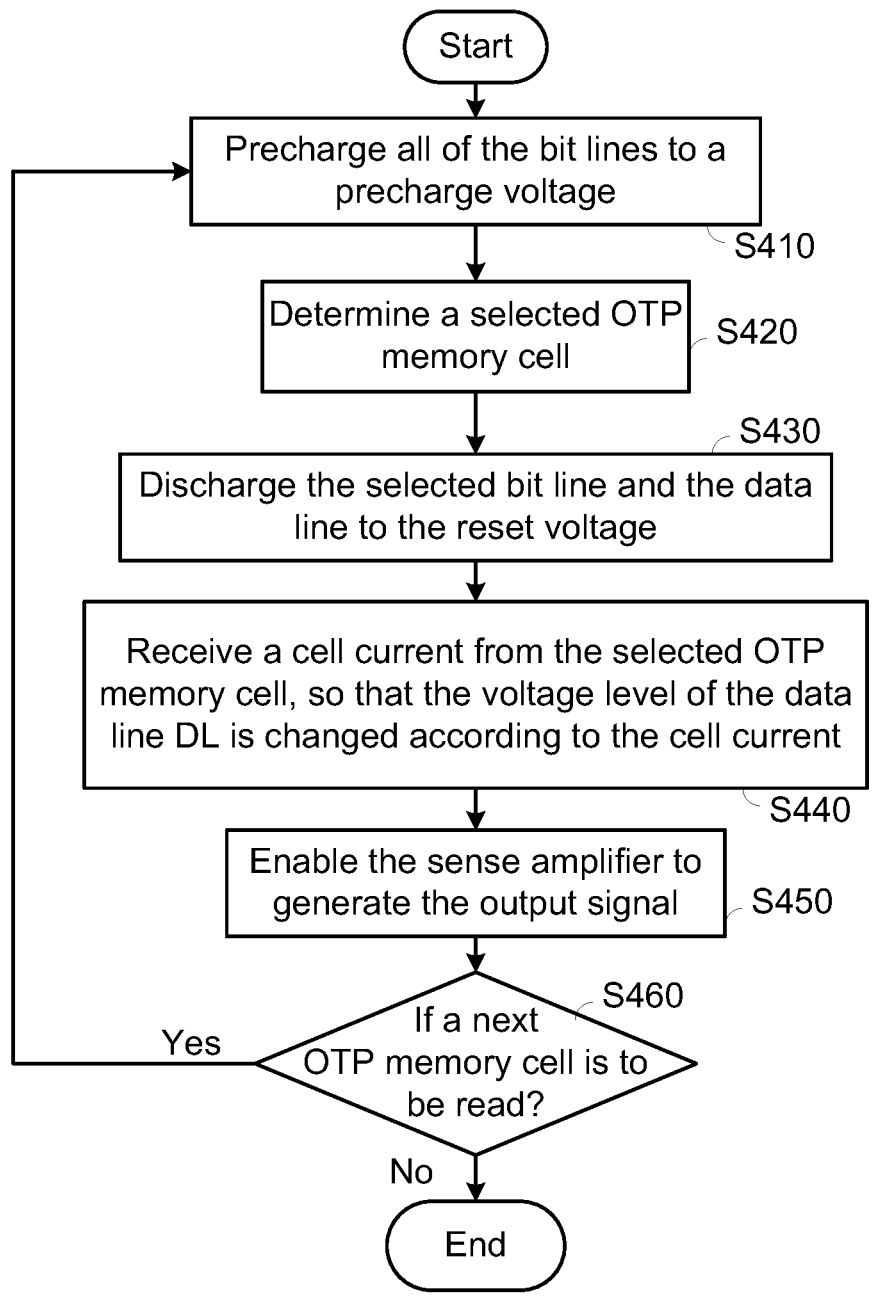
FIG. 4 is a flowchart illustrating a read sensing method of the OTP non-volatile memory according to an embodiment of the present invention.

FIG. 4 is a flowchart illustrating a read sensing method of the OTP non-volatile memory according to an embodiment of the present invention. It is assumed that the OTP memory cell Cn2 is the selected OTP memory cell. After the read cycle is started, the voltage generator 312 provides the first supply voltage V1 and the second supply voltage V2 to the memory array 320.

In a step S410, all bit lines are precharged to the precharge voltage Vpcg. That is, the timing controller 316 activates the precharge signal Ppcg. Consequently, all of the switch transistors ma1~ma4 of the precharge circuit 330 are in a close state. Under this circumstance, the bit lines BL1~BL4 are all precharged to the precharge voltage Vpcg. Then, the timing controller 316 inactivates the precharge signal Ppcg. Consequently, all of the switch transistors ma1~ma4 of the precharge circuit 330 are in an open state. Under this circumstance, the voltage levels of the bit lines BL1~BL4 are all maintained at the precharge voltage Vpcg.

In a step S420, a selected OTP memory cell is determined. That is, the word line driver 313 drives the word line WLn, so that the word line WLn is the selected word line. In addition, the column driver 314 drives the column decoding signal Y2 but does not drive the column decoding signals Y1, Y3 and Y4. Consequently, the select transistor M2 of the column selector 340 is in the close state, but the other select transistors M1, M3 and M4 are in the open state. Consequently, the bit line BL2 is the selected bit line and connected with the data line DL. Moreover, the OTP memory cell Cn2 is the selected OTP memory cell according to the selected word line and the selected bit line.

In a step S430, the selected bit line and the data line DL are discharged to the reset voltage Vrst. That is, the timing controller 316 activates the reset signal Prst. Consequently, the switch transistor mb of the reset circuit 370 is in the close state. Meanwhile, the data line DL and the selected bit line BL2 are discharged to the reset voltage Vrst. Then, the timing controller 316 inactivates the reset signal Prst. Consequently, the switch transistor mb of the reset circuit 370 is in the open state.

In a step S440, a cell current outputted from the selected OTP memory cell is received by the data line DL, and the voltage level of the data line DL is changed according to the cell current. That is, the cell current outputted from the selected OTP memory cell flows to the data line DL through the selected bit line BL2, and the data line DL is charged by the cell current. In this way, the voltage level of the data line DL is gradually increased from the reset voltage Vrst.

In a step S450, the sense amplifier 360 is enabled to generate the output signal Dout. That is, the enable signal EN is activated by the timing controller 316. According to the activated enable signal EN, the sense amplifier 360 is enabled. By comparing the voltage level of the data line DL with the comparing voltage Vcmp, the sense amplifier 360 generates the output signal Dout. The output signal Dout indicates the storage state of the selected OTP memory cell.

Then, a step S460 is performed to judge whether a next OTP memory cell needs to be read. If the judging condition of the step S460 is satisfied, the step S410 is repeatedly done. Whereas, if the judging condition of the step S460 is not satisfied, the read cycle is ended.

Figure 5:
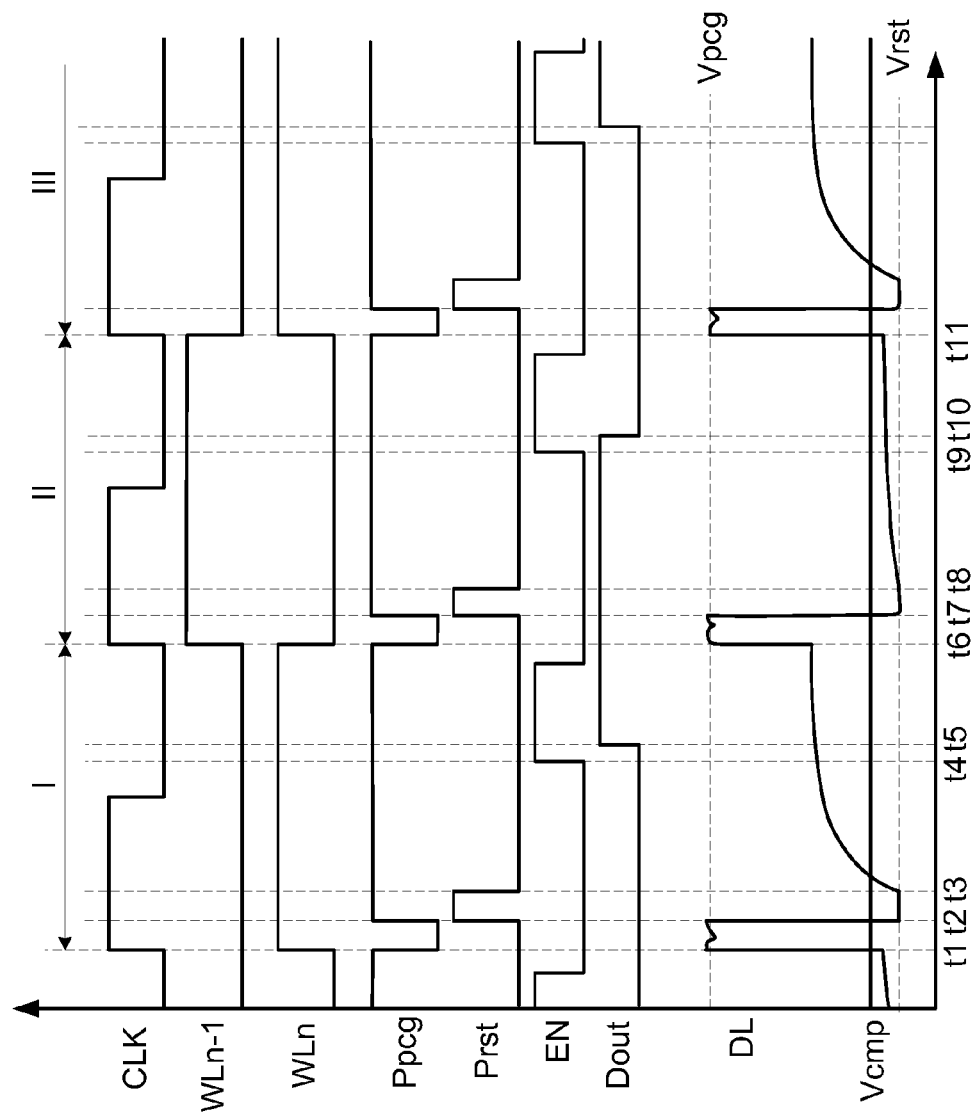
FIG. 5 is a sequence diagram illustrating associated signals for the OTP non-volatile memory during the read cycle according to the embodiment of the present invention.

FIG. 5 is a sequence diagram illustrating associated signals for the OTP non-volatile memory during the read cycle according to the embodiment of the present invention. As mentioned above, the timing controller 316 generates the precharge signal Ppcg, the reset signal Prst and the enable signal EN according to the clock signal CLK. Moreover, the sense amplifier 360 judges the storage state of the selected OTP memory cell during one clock cycle of the clock signal CLK.

During the clock cycle I from the time point t1 to the time point t6, the word line WLn is driven. From the time point t1 to the time point t2, the precharge signal Ppcg is activated. Consequently, the data line DL is precharged to the precharge voltage Vpcg. From the time point t2 to the time point t3, the reset signal Prst is activated. Consequently, the data line DL is discharged to the reset voltage Vrst.

From the time point t3 to the time point t4, the cell current outputted from the selected OTP memory cell is received by the data line DL. Consequently, the voltage level of the data line DL is gradually increased from the reset voltage Vrst. Generally, the rise rate of the voltage level of the data line DL is determined according to the cell current of the selected OTP memory cell. If the cell current of the selected OTP memory cell is larger, the rise rate of the voltage level of the data line DL is higher. Whereas, if the cell current of the selected OTP memory cell is smaller, the rise rate of the voltage level of the data line DL is lower.

At the time point t4, the enable signal EN is activated. According to the activated enable signal EN, the sense amplifier 360 is enabled. Consequently, the sense amplifier 360 may compare the voltage level of the data line DL with the comparing voltage Vcmp. At the time point t5, since the comparing voltage Vcmp is smaller than the voltage level of the data line DL, the sense amplifier 360 generates the output signal Dout with a first logic level (e.g. a high logic level). The output signal Dout with the first logic level indicates the low-impedance storage state of the selected OTP memory cell.

During the clock cycle II from the time point t6 to the time point t11, the word line WLn-1 is driven. From the time point t6 to the time point t7, the precharge signal Ppcg is activated. Consequently, the data line DL is precharged to the precharge voltage Vpcg. From the time point t7 to the time point t8, the reset signal Prst is activated. Consequently, the data line DL is discharged to the reset voltage Vrst.

From the time point t8 to the time point t9, the cell current outputted from the selected OTP memory cell is received by the data line DL. Consequently, the voltage level of the data line DL is gradually increased from the reset voltage Vrst.

At the time point t9, the enable signal EN is activated. According to the activated enable signal EN, the sense amplifier 360 is enabled. Consequently, the sense amplifier 360 may compare the voltage level of the data line DL with the comparing voltage Vcmp. At the time point t10, since the comparing voltage Vcmp is larger than the voltage level of the data line DL, the sense amplifier 360 generates the output signal Dout with a second logic level (e.g. a low logic level). The output signal Dout with the first logic level indicates the high-impedance storage state of the selected OTP memory cell.

The working principles of the clock cycle III are similar to those mentioned above, and are not redundantly described herein.

From the above descriptions, the bit line corresponding to the selected OTP memory cell is continuously connected with the data line DL during the read cycle. Consequently, the cell current outputted from the selected OTP memory cell can continuously charge the data line DL, and the sense amplifier 360 can judge the storage state of the selected OTP memory cell.

In this embodiment as shown in FIG. 5, one sense amplifier 360 is enabled by the timing controller 316 during one clock cycle. It is noted that numerous modifications and alterations may be made while retaining the teachings of the invention. For example, in another embodiment, plural pulses of the enable signal EN is generated to enable the sense amplifiers 360 plural times during one clock cycle. Consequently, the sense amplifier 360 senses the data line DL plural times, and then generates plural output signals Dout. Since the storage state of the selected OTP memory cell is judged according to the plural output signals Dout, the possibility of misjudgment will be minimized.

Moreover, in the OTP non-volatile memory 300 of FIG. 3, the sense amplifier 360 is operated in a single-ended mode to sense the storage state of the selected OTP memory cell. In some other embodiments, the sense amplifier may be operated in a differential mode to sense the storage state of the selected OTP memory cell. Under this circumstance, the memory array of the OTP non-volatile memory should be correspondingly modified.

Figure 6A:
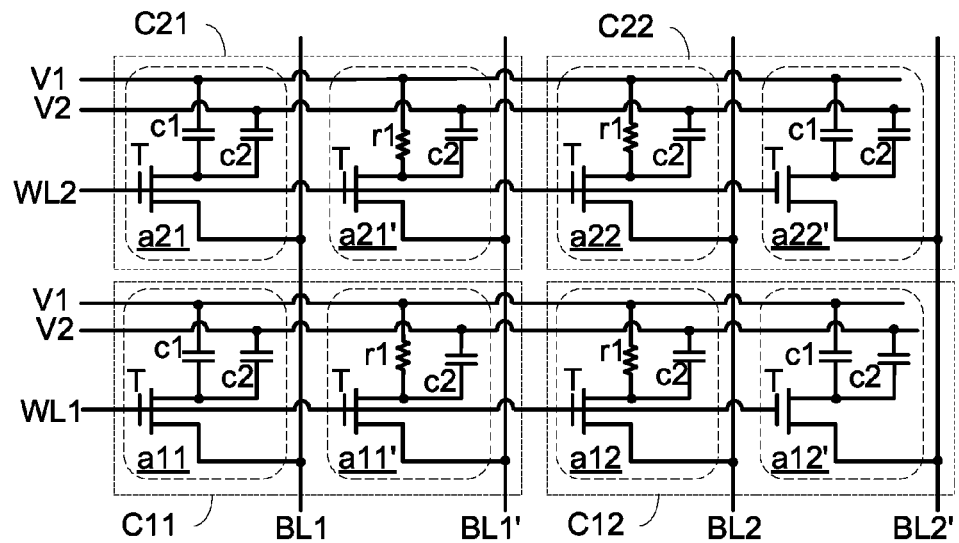
FIGS. 6A and 6B are schematic circuit diagrams illustrating two exemplary memory cell configurations used in an OTP non-volatile memory with a differential mode sense amplifier according to the present invention.
Figure 6B:
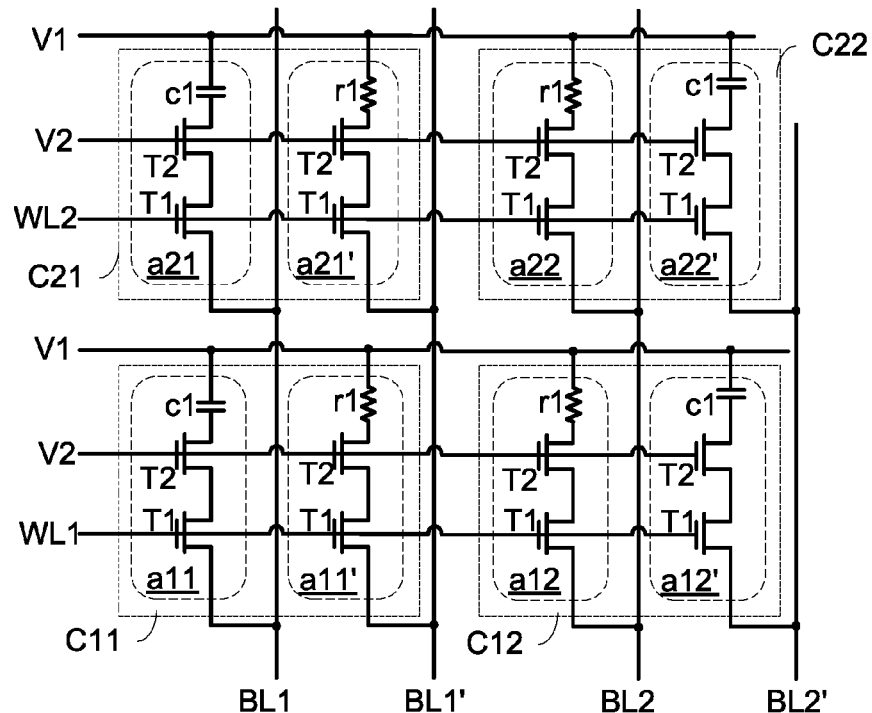

FIGS. 6A and 6B are schematic circuit diagrams illustrating two exemplary memory cell configurations used in an OTP non-volatile memory with a differential mode sense amplifier according to the present invention.

As shown in FIG. 6A, a memory array of the OTP non-volatile memory comprises four OTP memory cells C11, C12, C21 and C22, which are arranged in a 2×2 array configuration. Each of the OTP memory cells C11, C12, C21 and C22 is composed of six electronic components, and is divided into two cell elements. The storing states of the two cell elements may be complementary. It is noted that the size of the memory array is not restricted. According to the practical requirements, the memory array may comprise M×N memory cells corresponding to M word lines and 2N bit lines, wherein M and N are positive integers.

For example, the OTP memory cells C11 and C21 are first type OTP memory cells, and the OTP memory cells C12 and C22 are second type OTP memory cells.

For example, in the first type OTP memory cell C11, the cell element a11 comprises a select transistor T and two capacitors c1 and c2, and the cell element a11' comprises a select transistor T, a resistor r1 and a capacitor c2. Obviously, in the first type OTP memory cell C11, the cell element a11 has a high-impedance storage state, and the cell element a11' has a low-impedance storage state.

In the cell element a11, the gate terminal of the select transistor T is connected with the word line WL1, the capacitor c1 is connected between the first source/drain terminal of the select transistor T and a first supply voltage V1, the capacitor c2 is connected between the first source/drain terminal of the select transistor T and a second supply voltage V2, and the second source/drain terminal of the select transistor T is connected with the bit line BL1. In the cell element a11', the gate terminal of the select transistor T is connected with the word line WL1, the resistor r1 is connected between a first source/drain terminal of the select transistor T and the first supply voltage V1, the capacitor c2 is connected between the first source/drain terminal of the select transistor T and the second supply voltage V2, and second source/drain terminal of the select transistor T is connected with the bit line BL1'. Moreover, the bit line BL1 and the bit line BL1' are collaboratively defined as a complementary bit line pair.

For example, in the second type OTP memory cell C12, the cell element a12 comprises a select transistor T, a resistor r1 and a capacitor c2, and the cell element a12' comprises a select transistor T and two capacitors c1 and c2. Obviously, in the second type OTP memory cell C12, the cell element a12 has the low-impedance storage state, and the cell element a12' has the high-impedance storage state.

In the cell element a12, the gate terminal of the select transistor T is connected with the word line WL1, the resistor r1 is connected between a first source/drain terminal of the select transistor T and the first supply voltage V1, the capacitor c2 is connected between the first source/drain terminal of the select transistor T and the second supply voltage V2, and second source/drain terminal of the select transistor T is connected with the bit line BL2. In the cell element a12', the gate terminal of the select transistor T is connected with the word line WL1, the capacitor c1 is connected between the first source/drain terminal of the select transistor T and a first supply voltage V1, the capacitor c2 is connected between the first source/drain terminal of the select transistor T and a second supply voltage V2, and the second source/drain terminal of the select transistor T is connected with the bit line BL2'. Moreover, the bit line BL2 and the bit line BL2' are collaboratively defined as a complementary bit line pair.

Moreover, the OTP memory cell corresponding to the selected word line and the selected complementary bit line pair is determined as a selected OTP memory cell. For example, if the word line WL2 and the complementary bit line pair BL1 and BL1' are selected, the OTP memory cell C21 is the selected OTP memory cell. Meanwhile, the cell element a21 and the a21' generate cell currents to the bit lines BL1 and BL1', respectively. That is, if the word line WL2 is the selected word line and the complementary bit line pair BL1 and BL1' is the selected bit line pair, the OTP memory cell C21 is the selected OTP memory cell.

As shown in FIG. 6B, a memory array of the OTP non-volatile memory comprises four OTP memory cells C11, C12, C21 and C22, which are arranged in a 2×2 array configuration. Each of the OTP memory cells C11, C12, C21 and C22 is composed of six electronic components, and is divided into two cell elements. The storing states of the two cell elements may be complementary.

For example, the OTP memory cells C11 and C21 are first type OTP memory cells, and the OTP memory cells C12 and C22 are second type OTP memory cells.

For example, in the first type OTP memory cell C11, the cell element a11 comprises a select transistor T1, a bias transistor T2 and a capacitor c1, and the cell element a11' comprises a select transistor T1, a bias transistor T2 and a resistor r1. Obviously, in the first type OTP memory cell C11, the cell element a11 has a high-impedance storage state, and the cell element a11' has a low-impedance storage state.

In the cell element a11, the gate terminal of the select transistor T1 is connected with the word line WL1, the first source/drain terminal of the select transistor T1 is connected with the first source/drain terminal of the bias transistor T2, the second source/drain terminal of the select transistor T1 is connected with the bit line BL1, the gate terminal of the bias transistor T2 is connected with the second supply voltage V2, and the capacitor c1 is connected between the second source/drain terminal of the bias transistor T2 and the first supply voltage V1. In the cell element a11', the gate terminal of the select transistor T1 is connected with the word line WL1, the first source/drain terminal of the select transistor T1 is connected with the first source/drain terminal of the bias transistor T2, the second source/drain terminal of the select transistor T1 is connected with the bit line BL1', the gate terminal of the bias transistor T2 is connected with the second supply voltage V2, and the resistor r1 is connected between the second source/drain terminal of the bias transistor T2 and the first supply voltage V1. Moreover, the bit line BL1 and the bit line BL1' are collaboratively defined as a complementary bit line pair.

For example, in the second type OTP memory cell C12, the cell element a12 comprises a select transistor T1, a bias transistor T2 and a resistor r1, and the cell element a12' comprises a select transistor T1, a bias transistor T2 and a capacitor c1. Obviously, in the second type OTP memory cell C12, the cell element a12 has the low-impedance storage state, and the cell element a12' has the high-impedance storage state.

In the cell element a12, the gate terminal of the select transistor T1 is connected with the word line WL1, the first source/drain terminal of the select transistor T1 is connected with the first source/drain terminal of the bias transistor T2, the second source/drain terminal of the select transistor T1 is connected with the bit line BL2, the gate terminal of the bias transistor T2 is connected with the second supply voltage V2, and the resistor r1 is connected between the second source/drain terminal of the bias transistor T2 and the first supply voltage V1. In the cell element a12', the gate terminal of the select transistor T1 is connected with the word line WL1, the first source/drain terminal of the select transistor T1 is connected with the first source/drain terminal of the bias transistor T2, the second source/drain terminal of the select transistor T1 is connected with the bit line BL2', the gate terminal of the bias transistor T2 is connected with the second supply voltage V2, and the capacitor c1 is connected between the second source/drain terminal of the bias transistor T2 and the first supply voltage V1. Moreover, the bit line BL2 and the bit line BL2' are collaboratively defined as a complementary bit line pair.

Similarly, the OTP memory cell corresponding to the selected word line and the selected complementary bit line pair is determined as a selected OTP memory cell. For example, if the word line WL2 and the complementary bit line pair BL1 and BL1' are selected, the OTP memory cell C21 is the selected OTP memory cell.

Figure 7:
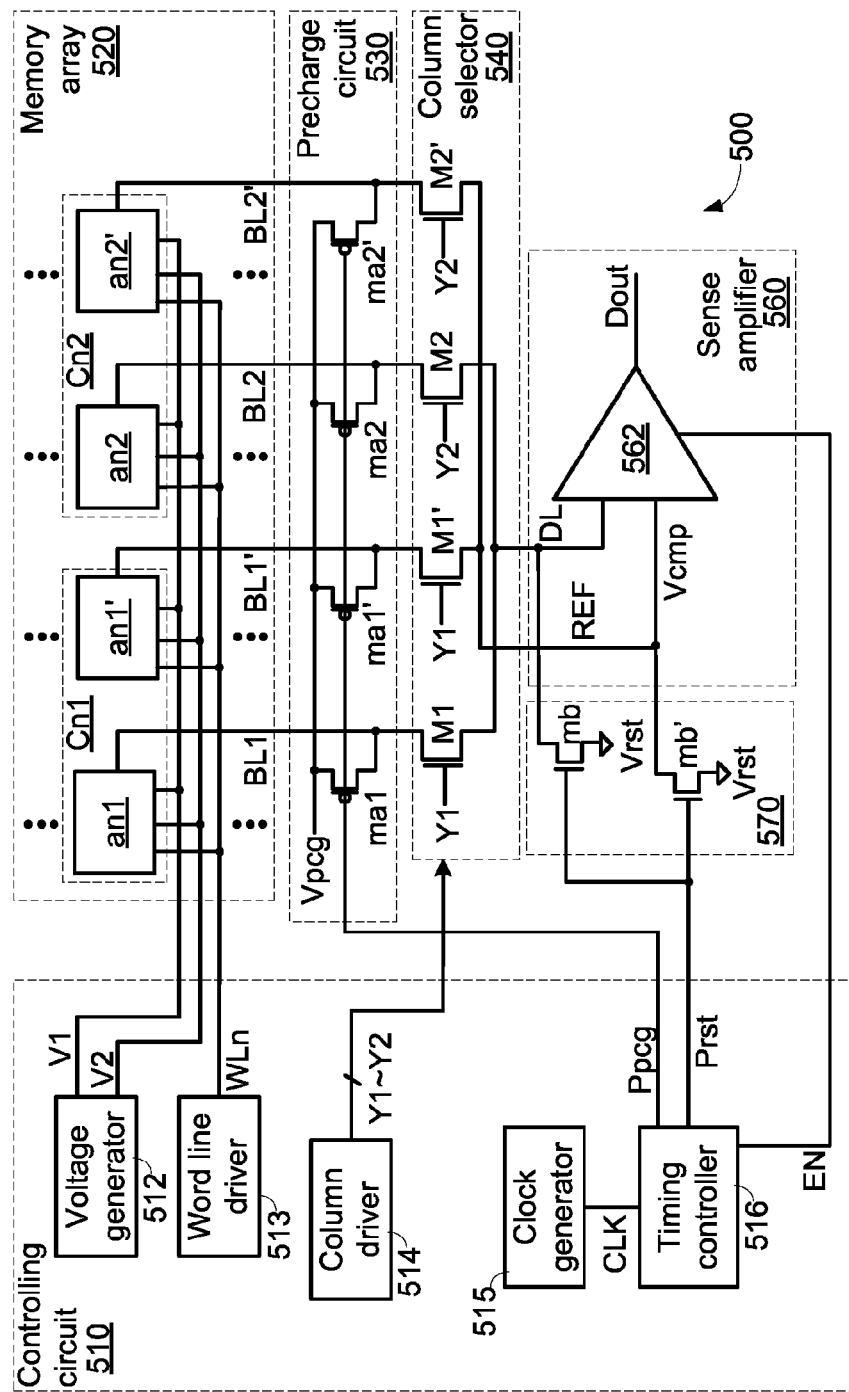
FIG. 7 is a schematic circuit diagram illustrating an OTP non-volatile memory according to another embodiment of the present invention.

FIG. 7 is a schematic circuit diagram illustrating an OTP non-volatile memory according to another embodiment of the present invention. As shown in FIG. 7, the OTP non-volatile memory 500 comprise a controlling circuit 510, a memory array 520, a precharge circuit 530, a column selector 540, a sense amplifier 560 and a reset circuit 570. The memory array 520 comprises plural OTP memory cells. For clarification and brevity, only the OTP memory cells Cn1 and Cn2 in the n-th row are shown. The OTP memory cells Cn1 is connected with the complementary bit line pair BL1 and BL1', and the OTP memory cells Cn2 is connected with the complementary bit line pair BL2 and BL2'. Moreover, the OTP memory cells Cn1-Cn2 may have the configurations as shown in FIG. 6A or FIG. 6B. The operating principles of the controlling circuit 510 are similar to those of the controlling circuit 310 of FIG. 3, and are not redundantly described herein.

The precharge circuit 530 comprises four switch transistors ma1, ma1', ma2 and ma2'. The control terminals of the switch transistors ma1, ma1', ma2 and ma2' receive a precharge signal Ppcg. The first terminals of the switch transistors ma1, ma1', ma2 and ma2' are connected with a precharge voltage Vpcg. The second terminals of the switch transistors ma1, ma1', ma2 and ma2' are connected with the bit lines BL1, BL1', BL2 and BL2', respectively. When the precharge signal Ppcg is activated, the bit lines BL1, BL1', BL2 and BL2' are all precharged to the precharge voltage Vpcg. The column selector 540 comprises four select transistors M1, M1', M2 and M2'. The control terminals of the select transistors M1 and M1' receive a column decoding signal Y1, and the control terminals of the select transistors M2 and M2' receive a column decoding signal Y2. The first terminals of the select transistors M1, M1', M2 and M2' are connected with the bit lines BL1, BL1', BL2 and BL2', respectively. The second terminals of the select transistors M1 and M2 are connected with a data line DL. The second terminals of the select transistors M1' and M2' are connected with a reference line REF. Generally, the column driver 514 activates one of the column decoding signals Y1 and Y2 at a time so as to determine the selected bit line pair.

The reset circuit 570 comprises two switch transistors mb and mb'. The control terminals of the switch transistor mb and mb' receive the reset signal Prst. The first terminal of the switch transistor mb is connected with the data line DL. The second terminal of the switch transistor mb is connected with a reset voltage Vrst (e.g. a ground voltage). The first terminal of the switch transistor mb' is connected with the reference line REF. The second terminal of the switch transistor mb' is connected with the reset voltage Vrst. When the reset signal Prst is activated, the data line DL and the reference line REF are discharged to the reset voltage Vrst.

The sense amplifier 560 comprises a comparator 562. The comparator 562 is connected with the data line DL and the reference line REF. When the enable signal EN is activated, the comparator 562 generates an output signal Dout according to the result of comparing a voltage level of the data line DL with a comparing voltage Vcmp of the reference line REF.

During a read cycle of the OTP non-volatile memory 500, the voltage generator 512 provides the first supply voltage V1 and the second supply voltage V2 to the memory array 520. Before the process of determining the selected OTP memory cell, the timing controller 516 activates the precharge signal Ppcg. Consequently, the bit lines BL1, BL1', BL2 and BL2' are all precharged to the precharge voltage Vpcg. Then, the word line driver 513 and the column driver 514 determine a selected word line and a selected bit line. Consequently, the selected OTP memory cell is determined, and the bit lines corresponding to the selected OTP memory cell are connected with the data line DL and the reference line REF. Then, the reset signal Prst is activated. Consequently, the data line DL, the reference line REF and the bit lines corresponding to the selected OTP memory cell are discharged to the reset voltage Vrst. After the reset signal Prst is inactivated, the voltage level of the data line DL and the reference line REF are changed from the reset voltage. Then, the enable signal EN is activated. By comparing the voltage level of the data line DL with the comparing voltage Vcmp of the reference line REF, the sense amplifier 560 generates the output signal Dout. The output signal Dout indicates the storage state of the selected OTP memory cell.

In the above embodiment, the two cell elements of the selected OTP memory cell generate two cell currents. The two cell currents can charge the data line DL and the reference line REF through the bit lines corresponding to the selected OTP memory cell. Moreover, when the sense amplifier 560 is enabled, the comparator 562 of sense amplifier 560 compares the voltage level of the data line DL with the comparing voltage Vcmp of the reference line REF so as to generate the output signal Dout. The output signal Dout may indicate whether the storage state of the selected OTP memory cell is the first type OTP memory cell or the second type OTP memory cell. Since the storing states of the two cell elements are complementary, the difference between the magnitudes of the two cell currents is very large. Under this circumstance, the difference between the voltage level of the data line DL and the comparing voltage Vcmp of the reference line REF is very large. Consequently, the accuracy of the output signal Dout from the sense amplifier 560 is further enhanced.

From the above descriptions, the present invention provides a one time programmable non-volatile memory and a read sensing method thereof. During the read cycle, the bit line corresponding to the selected OTP memory cell is continuously connected with the data line. Consequently, the cell current outputted from the selected OTP memory cell can continuously charge the data line. According to the output signal, the storage state of the selected OTP memory cell can be recognized.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An OTP non-volatile memory, comprising:
   a memory array comprising M×N memory cells, wherein the memory array is connected with M word lines and 2N bit lines, and the 2N bit lines are divided into N bit line pairs;
   a controlling circuit comprising a voltage generator, a word line driver, a column driver and a timing controller, wherein the voltage generator provides plural supply voltages to the memory array, the word line driver is connected with the M word lines for determining one of the M word lines as a selected word line, the column driver generates N column decoding signals and activates one of the plural column decoding signals at a time, and the timing controller generates a precharge signal, a reset signal and an enable signal;
   a precharge circuit connected with the 2N bit lines, wherein when the precharge signal is activated, the precharge circuit provides a precharge voltage to the 2N bit lines;
   a column selector connected with the 2N bit lines, a reference line and a data line, wherein the column selector determines one of the N bit line pairs as a selected bit line pair according to the N column decoding signals, so that a first bit line of the selected bit line pair is connected with the data line and a complementary first bit line of the selected bit line pair is connected with the reference line;
   a reset circuit connected with the data line and the reference line, wherein when the reset signal is activated, the reset circuit provides a reset voltage to the data line and the reference line, wherein the precharge voltage is higher than the reset voltage; and
   a sense amplifier connected with the data line and the reference line, wherein when the enable signal is activated, the sense amplifier generates an output signal according to a result of comparing a voltage level of the data line with a comparing voltage of the reference line.

2. The OTP non-volatile memory as claimed in claim 1, wherein the precharge circuit comprises 2N switch transistors, wherein control terminals of the 2N switch transistors receive the precharge signal, first terminals of the 2N switch transistors are connected with the precharge voltage, and second terminals of the 2N switch transistors are connected with the 2N bit lines, respectively.

3. The OTP non-volatile memory as claimed in claim 1, wherein the column selector comprises 2N select transistors, and the 2N select transistors are divided into N select transistor pairs, wherein control terminals of the N select transistor pairs receive the N column decoding signals, respectively, wherein each select transistor pair of the N select transistor pairs has two first terminals connected with the corresponding bit line pair, wherein each select transistor pair of the N select transistor pairs has one second terminal connected with the data line and the other second terminal connected to the reference line.

4. The OTP non-volatile memory as claimed in claim 1, wherein the reset circuit comprises a first switch transistor and a second switch transistor, wherein a control terminal of the first switch transistor receives the reset signal, a first terminal of the first switch transistor is connected with the data line, and a second terminal of the first switch transistor is connected with the reset voltage, wherein a control terminal of the second switch transistor receives the reset signal, a first terminal of the second switch transistor is connected with the reference line, and a second terminal of the second switch transistor is connected with the reset voltage.

5. The OTP non-volatile memory as claimed in claim 1, wherein the sense amplifier comprises a comparator, wherein the comparator is connected with the data line and the reference line, wherein when the enable signal is activated, the comparator generates the output signal.

6. The OTP non-volatile memory as claimed in claim 1, wherein a selected memory cell of the memory array is determined according to the selected word line and the selected bit line pair.

7. The OTP non-volatile memory as claimed in claim 6, wherein during a read cycle, a first memory current generated by the selected memory cell charges the data line and a second memory current generated by the selected memory cell charges the reference line, so that the voltage level of the data line is gradually changed from the reset voltage and the comparing voltage of the reference line is gradually changed from the reset voltage.

8. The OTP non-volatile memory as claimed in claim 1, wherein the plural supply voltages comprise a first supply voltage and a second supply voltage, and a first memory cell of the M×N memory cells comprises:
a first cell element comprising a first select transistor, a first capacitor and a second capacitor, wherein a gate terminal of the first select transistor is connected with a first word line of the M word lines, a second source/drain terminal of the first select transistor is connected with the first bit line, the first capacitor connected is between a first source/drain terminal of the first select transistor and the first supply voltage, and the second capacitor is connected between the first source/drain terminal of the first select transistor and the second supply voltage; and a second cell element comprising a second select transistor, a first resistor and a third capacitor, wherein a gate terminal of the second select transistor is connected with the first word line, a second source/drain terminal of the second select transistor is connected with the complementary first bit line, the first resistor is connected between a first source/drain terminal of the second select transistor and the first supply voltage, and the third capacitor is connected between the first source/drain terminal of the second select transistor and the second supply voltage.

9. The OTP non-volatile memory as claimed in claim 1, wherein the plural supply voltages comprise a first supply voltage and a second supply voltage, and a first memory cell of the M×N memory cells comprises:
a first cell element comprising a first select transistor, a first bias transistor and a first capacitor, wherein a gate terminal of the first select transistor is connected with a first word line of the M word lines, a second source/drain terminal of the first select transistor is connected with the first bit line, a gate terminal of the first bias transistor is connected with the second supply voltage, a first source/drain terminal of the first bias transistor is connected with a first source/drain terminal of the first select transistor, and the first capacitor is connected between a second source/drain terminal of the first bias transistor and the first supply voltage; and
a second cell element comprising a second select transistor, a second bias transistor and a first resistor, wherein a gate terminal of the second select transistor is connected with the first word line, a second source/drain terminal of the second select transistor is connected with the complementary first bit line, a gate terminal of the second bias transistor is connected with the second supply voltage, a first source/drain terminal of the second bias transistor is connected with a first source/drain terminal of the second select transistor, and the first resistor connected between a second source/drain terminal of the second bias transistor and the first supply voltage.

10. A read sensing method for an OTP non-volatile memory, the OTP non-volatile memory comprising a memory array comprising plural memory cells, the memory array being connected with plural bit line pairs, the read sensing method comprising steps of:
precharging the plural bit line pairs to a precharge voltage;
determining a selected memory cell from the memory array, wherein the selected memory cell is connected with a selected bit line pair;
allowing a first bit line and a second bit line of the selected bit line pair corresponding to the selected memory cell to be connected with a data line and a reference line respectively, and discharging the data line and the reference line to a reset voltage, wherein the precharge voltage is higher than the reset voltage;
receiving a first cell current from the first bit line of the selected bit line pair and a second cell current from the second bit line of the selected bit line pair, so that a first voltage level of the data line and a second voltage level of the reference line are gradually changed from the reset voltage; and
generating an output signal according to a result of comparing the first voltage level of the data line with the second voltage level of the reference line.

* * * * *